US011888447B2

(12) United States Patent
Shaik et al.

(10) Patent No.: US 11,888,447 B2
(45) Date of Patent: Jan. 30, 2024

(54) OPERATIONAL AMPLIFIER WITH INDIRECT CURRENT FEEDBACK CURRENT LIMITER

(71) Applicant: Texas Instruments Incorporated, Dallas, TX (US)

(72) Inventors: Munaf Hussain Shaik, Tucson, AZ (US); Srinivas Kumar Pulijala, Tucson, AZ (US); Vadim Valerievich Ivanov, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 211 days.

(21) Appl. No.: 17/232,985

(22) Filed: Apr. 16, 2021

(65) Prior Publication Data

US 2021/0359647 A1    Nov. 18, 2021

Related U.S. Application Data

(60) Provisional application No. 63/026,273, filed on May 18, 2020.

(51) Int. Cl.
*H03F 3/45* (2006.01)
*H03F 1/02* (2006.01)

(52) U.S. Cl.
CPC ....... *H03F 1/0233* (2013.01); *H03F 3/45475* (2013.01); *H03F 2200/462* (2013.01); *H03F 2200/471* (2013.01); *H03F 2200/504* (2013.01)

(58) Field of Classification Search
CPC .............. H03F 1/0233; H03F 3/45475; H03F 2200/462; H03F 2200/471; H03F 2200/504; H03F 3/45183; H03F 3/45179; H03F 3/45192; H03F 3/45089; H03F 3/3022; H03F 3/26; H03F 3/3088; H03F 1/22
USPC ......................................... 330/253, 255, 262
See application file for complete search history.

(56) References Cited

U.S. PATENT DOCUMENTS

| | | | |
|---|---|---|---|
| 6,356,153 B1 * | 3/2002 | Ivanov | H03F 3/3028 330/253 |
| 8,222,957 B2 * | 7/2012 | Kato | H03F 3/45 330/253 |

* cited by examiner

*Primary Examiner* — Khanh V Nguyen
(74) *Attorney, Agent, or Firm* — John R. Pessetto; Frank D. Cimino

(57) ABSTRACT

A circuit includes an operational amplifier having: a positive input; a negative input; an operational amplifier output; a differential front end; a positive channel (PCH) input stage; a negative channel (NCH) input stage; and an output stage. The operational amplifier also includes a current limit circuit coupled to an output of the output stage and including: an output current sense voltage circuit having an output configured to provide an output current sense voltage; an indirect current feedback circuit coupled to the output of the output current sense voltage circuit, the indirect current feedback circuit having an output configured to provide an output current feedback sense voltage responsive to the output current sense voltage; and control circuitry coupled to the indirect current feedback circuit and configured vary a resistance between the output stage output and ground responsive to a difference between the output current feedback sense voltage and a reference voltage.

22 Claims, 5 Drawing Sheets

OPERATIONAL AMPLIFIER WITH INDIRECT CURRENT FEEDBACK CURRENT LIMITER

CROSS-REFERENCE TO RELATED APPLICATIONS

This application claims priority to U.S. Provisional Application No. 63/026,273, filed May 18, 2020, which is hereby incorporated by reference.

BACKGROUND

As new electronic devices are developed and integrated circuit (IC) technology advances, new IC products are commercialized. One example IC product for electronic devices is an operational amplifier. Such operational amplifiers may be used in different applications, such as: multiplexed data-acquisition systems; test and measurement equipment; high-resolution analog-to-digital converter (ADC) driver amplifiers; successive-approximation-register (SAR) ADC reference buffers; programmable logic controllers; high-side or low-side current sensing; precision comparators; or other applications.

For some applications, an operational amplifier with an accurate current limit circuit is needed. Conventional current limit circuits rely on matching metal oxide semiconductor field-effect transistor (MOSFET) devices to perform current sensing. Achieved accuracy with this conventional approach varies depending on the current levels being sensed and is limited due to MOSFET matching constraints.

SUMMARY

In one example embodiment, a circuit comprises an operational amplifier having: a positive input; a negative input; an operational amplifier output; a differential front end with differential inputs and differential outputs. The differential inputs are coupled to the positive and negative inputs The operational amplifier also has a positive channel (PCH) input stage with PCH inputs and an PCH output, the PCH inputs coupled to the differential outputs; a negative channel (NCH) input stage with NCH inputs and an NCH output, the NCH inputs coupled to the differential outputs; and an output stage with output stage inputs and an output stage output, the output stage inputs coupled to the PCH and NCH outputs. The circuit also comprises a current limit circuit coupled to the output stage output. The current limit circuit has: an output current sense voltage circuit having an output configured to provide an output current sense voltage; and an indirect current feedback circuit coupled to the output of the output current sense voltage circuit, the indirect current feedback circuit having an output configured to provide an output current feedback sense voltage responsive to the output current sense voltage. The current limit circuit also has control circuitry coupled to the indirect current feedback circuit and configured vary a resistance between the output stage output and ground responsive to a difference between the output current feedback sense voltage and a reference voltage.

In another example embodiment, a system comprises an operational amplifier having: a positive signal input adapted to be coupled to an input side component; a negative signal input; and an amplifier output. The system also comprises a current limit circuit coupled to the amplifier output. The current limit circuit is configured to: generate an output current sense voltage in response to an output voltage of the operational amplifier; generate an output current feedback sense voltage responsive to the output current sense voltage; and limit an output current at the amplifier output responsive to the generated output current feedback sense voltage.

In another example embodiment, a current limiter adapted to be coupled to an output of an operational amplifier comprises: an input adapted to be coupled to the output of the operational amplifier; a first resistor coupled between the input and ground, the first resistor having a first terminal and a second terminal; a first amplifier having a first input connected to the first terminal of the first resistor, a second input connected to the second terminal of the first resistor, a first output and a second output. The current limiter also comprises a second amplifier having a third input, a fourth input, a third output coupled to the second output of the first amplifier, and a fourth output coupled to the first output of the first amplifier. The current limiter also comprises: a second resistor coupled between the third input and the fourth input; a third resistor coupled between the second output and ground; and a fourth resistor coupled between the first output and ground.

BRIEF DESCRIPTION OF THE DRAWINGS

The same reference numbers are used in the drawings to designate the same or similar (structurally and/or functionally) features.

DETAILED DESCRIPTION

Described herein is an operational amplifier that includes an indirect current feedback current limiter at its output. In some example embodiments, the operational amplifier is a two-stage class AB operational amplifier. The indirect current feedback current limiter provides an accurate current limit for the operational amplifier over a wide range of output currents. In some example embodiments, the operational amplifier is part of an integrated circuit (IC) or other circuit. In some example embodiments, the circuit is a stand-alone operational amplifier circuit with one or more operational amplifiers, related inputs/outputs, supply voltage input, and ground. In other examples, the circuit includes other components such as input-side components, output-side components, and/or feedback components. The particular arrangement of input-side components, output-side components, or feedback components varies for different circuits. Example circuits that may use an operational amplifier with an indirect current feedback current limiter include: multiplexed data-acquisition systems; test and measurement equipment; high-resolution analog-to-digital converter (ADC) driver amplifiers; successive-approximation-register (SAR) ADC reference buffers; programmable logic controllers; high-side or low-side current sensing; precision comparators; or other circuits.

Figure 1:
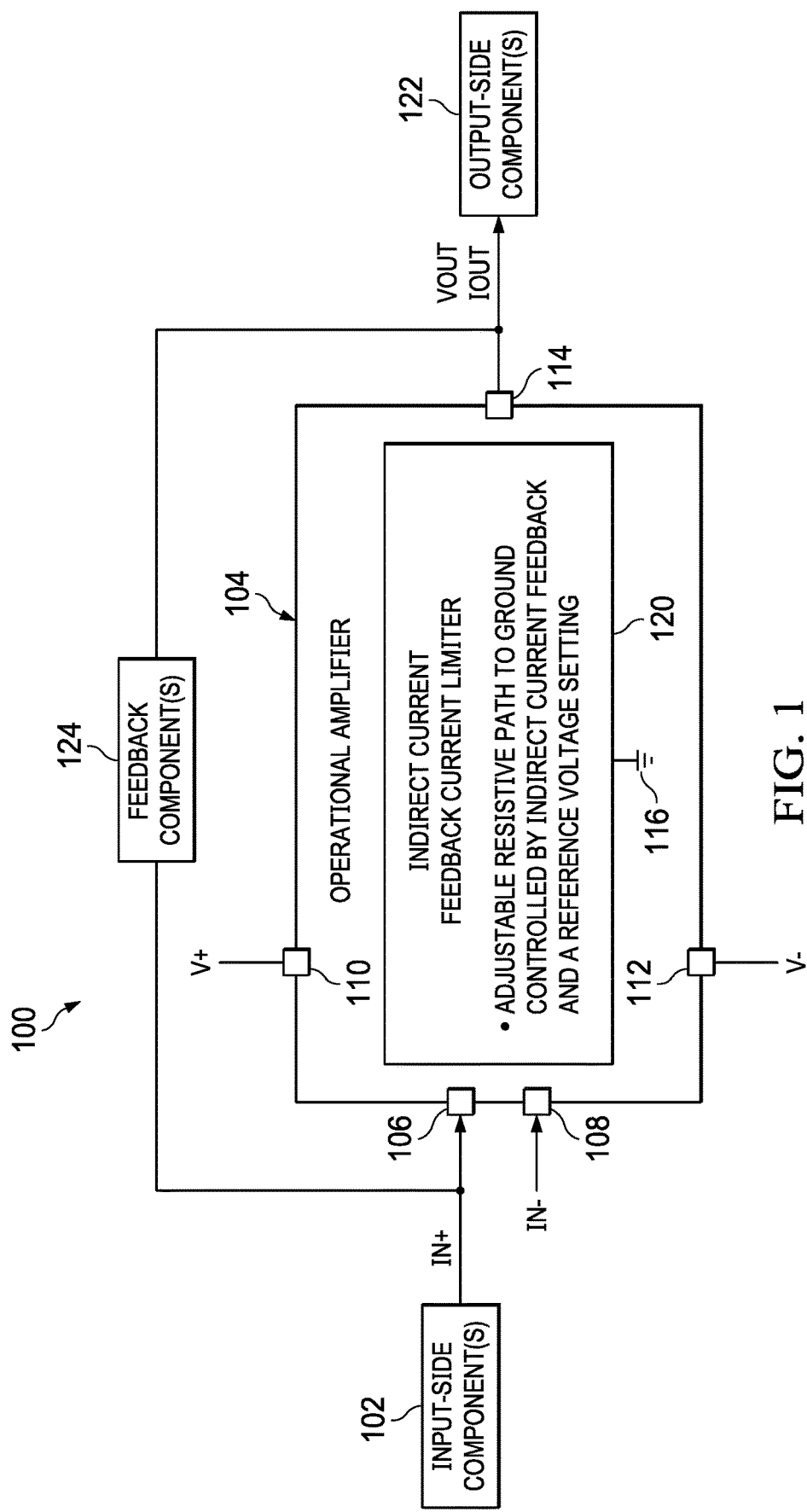
FIG. 1 is a diagram of a system in accordance with an example embodiment.

FIG. 1 is a diagram of a system 100 in accordance with an example embodiment. As shown, the system 100 includes an operational amplifier 104. In some example embodiments, the operational amplifier 104 is a two-stage class AB operational amplifier. As shown, the operational amplifier 104 includes differential signal (IN+ and IN−) inputs 106 and 108, and an output 114. The operational amplifier 104 also includes a positive voltage (V+) input 110 and a negative voltage (V−) input 112. The operational amplifier 104 also includes an indirect current feedback current limiter 120 coupled to the output 114. Although the indirect current feedback current limiter 120 is represented as being part of the operational amplifier 104 in FIG. 1, it could also be represented as separate from the operational amplifier 104 (e.g., a separate circuit coupled between the output 114 and ground 116). In the example of FIG. 1, the indirect current feedback current limiter 120 includes an adjustable resistive path to a ground, where the adjustable resistive path is controlled by a reference voltage setting and an indirect current feedback of the output current (IOUT) at the output 114. By adjusting the reference voltage setting, the IOUT limit at the output 114 of the operational amplifier 104 is adjustable within a wide range, where the indirect current feedback increases accuracy of the IOUT limit relative to conventional approaches that rely on matching metal oxide semiconductor field-effect transistor (MOSFET) devices to perform current sensing.

In the example of FIG. 1, the positive signal (IN+) input 106 of the operational amplifier 104 is coupled to input-side component(s) 102. In other example embodiments, the IN− input 106 of the operational amplifier 104 is coupled to input-side component(s) 102. Also, in some example embodiments, the output 114 of the operational amplifier 104 is coupled to output-side component(s) 122. Another option is to have feedback component(s) 124 between the output 114 and one or both of the differential inputs 106 and 108. In different example embodiments, the input-side component(s) 102, the feedback component(s) 124, and/or the output-side component(s) 122 are omitted.

In FIG. 1, the system 100 includes at least one IC. In some example embodiments, the operational amplifier 104 is part of an IC, while the input-side component(s) 102, the feedback component(s) 124, and the output-side component(s) 122 are external to the IC. In such case, the input-side component(s) 102, the feedback component(s) 124, and the output-side component(s) 122 may be part of another IC, or may be components mounted to a printed circuit board (PCB). In other example embodiments, the input-side component(s) 102, the feedback component(s) 124, and/or the output-side component(s) 122 are included with the IC having the operational amplifier 104.

Figure 2:
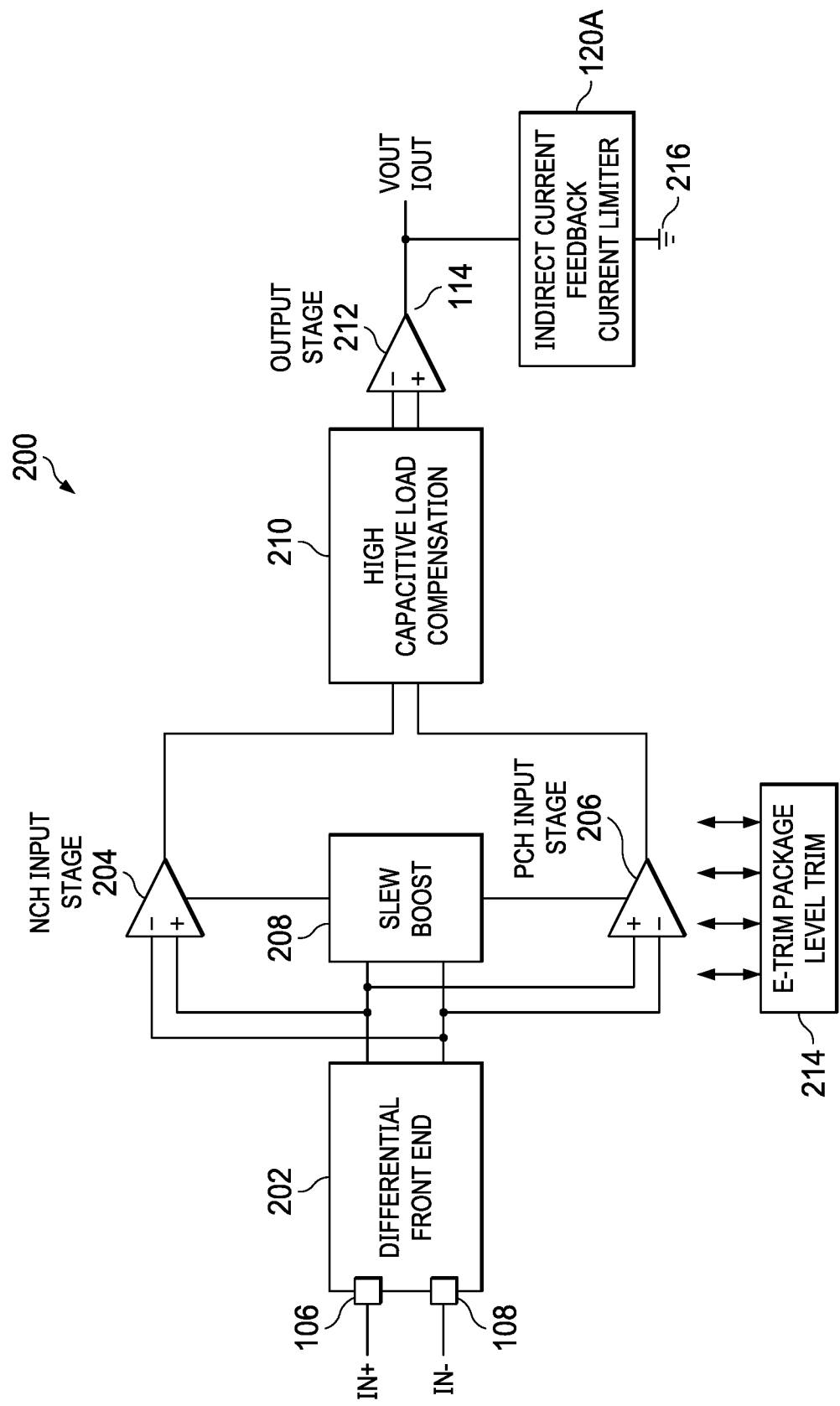
FIG. 2 is a block diagram of an operational amplifier in accordance with an example embodiment.

FIG. 2 is a block diagram of an operational amplifier 200 (e.g., the operational amplifier 104 in FIG. 1) in accordance with an example embodiment. In FIG. 2, the operational amplifier 200 is an example of a two-stage class AB operational amplifier. As shown, the operational amplifier 200 includes a differential front end 202 with IN+ input 106 and IN− input 108. The outputs from the differential front end 202 are provided to the inputs of a negative channel (NCH) input stage 204, the inputs of a positive channel (PCH) input stage 206, and the inputs of a slew boost circuit 208. In operation, the NCH input stage 204 and the PCH input stage 206 are configured to generate respective currents responsive to the difference between IN+ and IN−. The slew boost circuit 208 helps to expedite transitions in the outputs of the NCH input stage 204 and the PCH input stage 206. The outputs of the NCH input stage 204 and the PCH input stage 206 are provided to a high-capacitive load compensation circuit 210, which accounts for load variability at the output 114. The outputs of the high-capacitive load compensation circuit 210 are coupled to an output stage 212, which increases or decreases the output current (IOUT) at the output 114 responsive to the compensated signals output from the high-capacitive load compensation circuit 210. In some example embodiments, the output voltage (VOUT) of the operational amplifier 200 is predetermined or fixed (within a target tolerance) and is compatible with output-side components (e.g., the output-side component(s) 122 in FIG. 1).

In the example of FIG. 2, the operational amplifier 200 also includes an indirect current feedback current limiter 120A (an example of the indirect current feedback current limiter 120 in FIG. 1) coupled to the output 114. With the indirect current feedback current limiter 120A, there is an adjustable resistive path to a ground terminal 216 (an example of the ground terminal 116 in FIG. 1). In some example embodiments, the adjustable resistive path is controlled using a reference voltage setting and an indirect current feedback to adjust IOUT at the output 114. By adjusting the reference voltage setting, the OUT limit at the output 114 of the operational amplifier 104 is adjustable within a wide range (e.g., 50 mA-200 mA). The use of an indirect current feedback increases accuracy of the OUT limit relative to conventional approaches that rely on matching MOSFET devices to perform current sensing.

Figure 3:
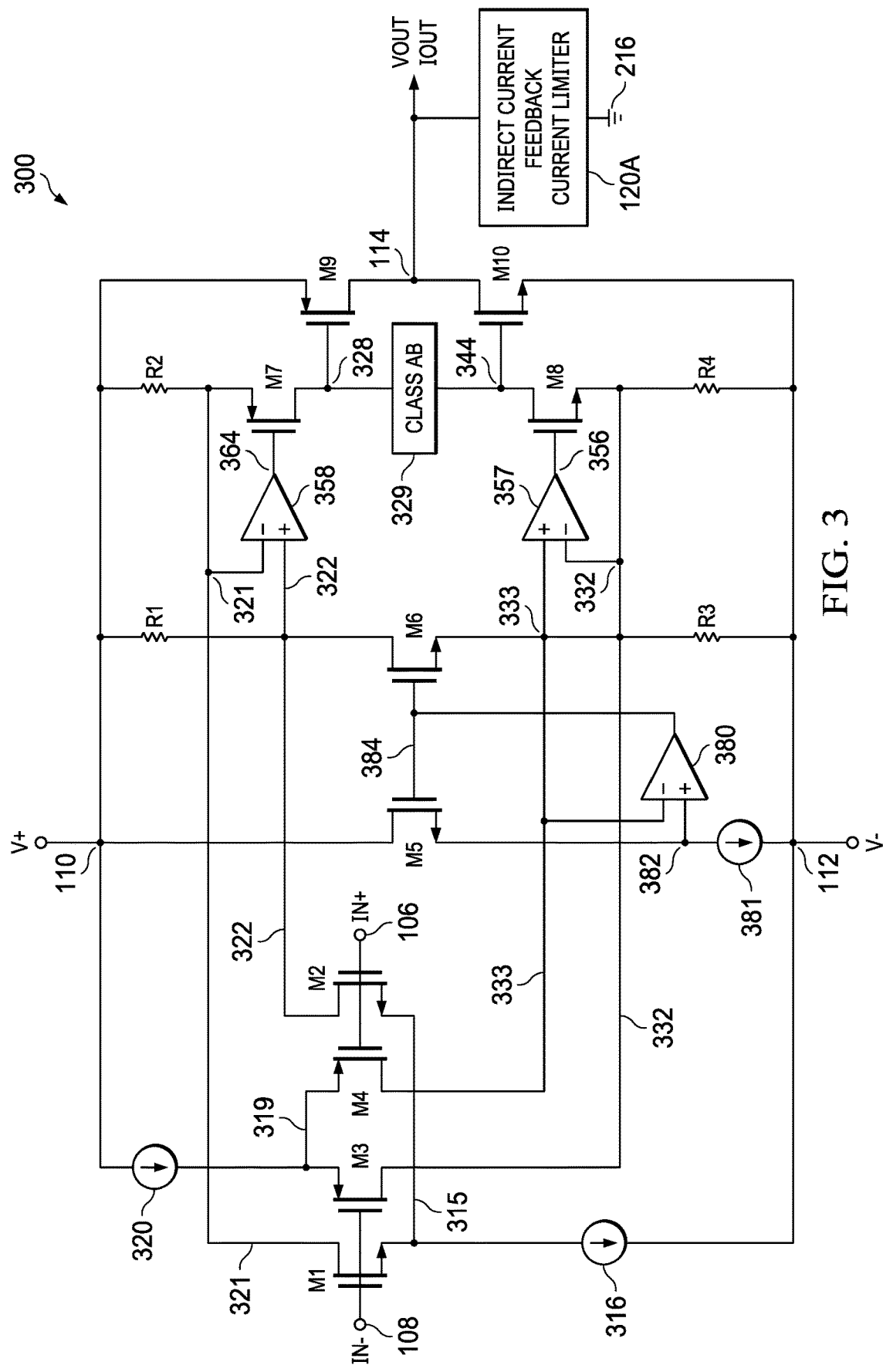
FIG. 3 is a schematic diagram of an operational amplifier in accordance with an example embodiment.

FIG. 3 is a diagram of an operational amplifier 300 in accordance with an example embodiment. In FIG. 3, the operational amplifier 300 is an example of a two-stage class AB operational amplifier. As shown, the operational amplifier 300 includes a differential front end (e.g., the differential front end 202 in FIG. 2) with input transistors M1-M4 and current sources 316 and 320. In some example embodiments, M1 and M2 are N-channel MOSFETs (NMOS), M3 and M4 are P-channel MOSFETs (PMOS), and current sources 316 and 320 are constant current sources. In the example of FIG. 3, the gate terminals of M1 and M3 are coupled to an IN− input 108. The gate terminals of M2 and M4 are coupled to a IN+ input 106. The source terminals of M1 and M2 are coupled by a conductor 315 to a first side of the current source 316. The second side of the current source 316 is coupled to the V− input 112. The source terminals of M3 and M4 are coupled by conductor 319 to a first side of the current source 320. The second side of the current source 320 is coupled to the V+ input 110.

The operational amplifier 300 also includes an output stage (e.g., the output stage 212 in FIG. 3) that includes transistor M9 (e.g., a PMOS output transistor), transistor M10 (e.g., an NMOS output transistor), a class AB circuit 329, transistor M7 (e.g., a PMOS cascode transistor), and transistor M8 (e.g., an NMOS cascode transistor). As shown, the output 114 of the operational amplifier (the output stage output) is coupled to the drain terminals of M9 and M10. Also, the source terminal of M9 is coupled to the V+ input 110, and the gate terminal of M9 is coupled to the drain terminal of M7 as well as a first side of the class AB circuit 329. The source terminal of M10 is coupled to the V− input 112, and the gate terminal of M10 is coupled to the drain terminal of M8 and a second side of the class AB circuit 329.

In FIG. 3, the source terminal of M7 is coupled by a conductor 321 to the drain of transistor M1. In addition, the source of M7 is coupled to a first side of a resister R2. The second side of R2 is coupled to the V+ input 110. The conductor 321 is also coupled to the inverting (−) input of a gain boost amplifier 358. The gate terminal of M7 is coupled to the output 364 of the gain boost amplifier 358. The non-inverting (+) input of the gain boost amplifier 358 is coupled to a conductor 322. M7 can be considered to be an output transistor of the gain boost amplifier 358.

The source terminal of M8 is coupled by a conductor 332 to the drain of transistor M3. In addition, the source of M8 is coupled to a first side of a resister R4 and to the inverting (−) input of a gain boost amplifier 357. The second side of R4 is coupled to the V− input 112. The non-inverting (+) input of the gain boost amplifier 357 is coupled to a node 333. The output 356 of gain boost amplifier 357 is coupled to the gate terminal of M8. M8 can be considered to be an output transistor of the gain boost amplifier 357. As shown, the node 333 also is coupled to the source terminal of transistor M6 (e.g., an N-channel cascode transistor) and a first side of a resister R3. The second side of R3 is coupled to the V− input 112. The node 333 is also coupled to the inverting (−) input of a differential bias control amplifier 380. The output of the differential bias control amplifier 380 is coupled by a conductor 384 to the gate terminals of transistors M5 (e.g., an N-channel feedback reference transistor) and M6. The drain terminal of M6 is coupled to a first side of a resister R1. The second side of R1 is coupled to the V+ input 110. As shown, the source terminal of M5 is coupled by at node 382 to the non-inverting (+) input of the differential bias control amplifier 380 and to a first side of a current source 381. The second side of the current source 381 is coupled to the V− input 112. Also, the drain terminal of M5 is coupled to the V+ input 110.

In operation, M6 simulates a "floating" constant current source connected between the conductors 322 and 333. The differential bias control amplifier 380 operates to maintain the source terminal voltage of M6 at the same voltage as the source terminal of M5. If the sizes (the ratio of width to length or W/L) of M5 and M6 are equal, then the current through both M5 and M6 is equal to the constant current through the current source 381, even if the voltage on the conductor 333 varies substantially. In FIG. 3, the differential bias control amplifier 380 is part of a bias control circuit that also includes M5, M6, and the current source 381. In operation, the bias control circuit can operate at a very low rail-to-rail voltage (e.g. equal to the sum of a gate-to-source voltage (VGS) and two drain-to-source (VDS) saturation voltages). In some example embodiments, V+ input 110 is coupled to a positive supply rail (e.g. +5 volts, +1.8 volts) and V− input 112 is coupled to a negative (relative) supply rail (e.g. −5 volts, −1.8 volts or ground).

In the example of FIG. 3, the operational amplifier 300 also includes the indirect current feedback current limiter 120A (an example of the indirect current feedback current limiter 120 in FIG. 1) coupled to the output 114. With the indirect current feedback current limiter 120A there is an adjustable resistive path to the ground terminal 216. In some example embodiments, the adjustable resistive path is controlled using a reference voltage setting and an indirect current feedback to adjust OUT at the output 114. By adjusting the reference voltage setting, the OUT limit at the output 114 of the operational amplifier 300 is adjustable within a wide range (e.g., 50 mA-200 mA).

Figure 4:
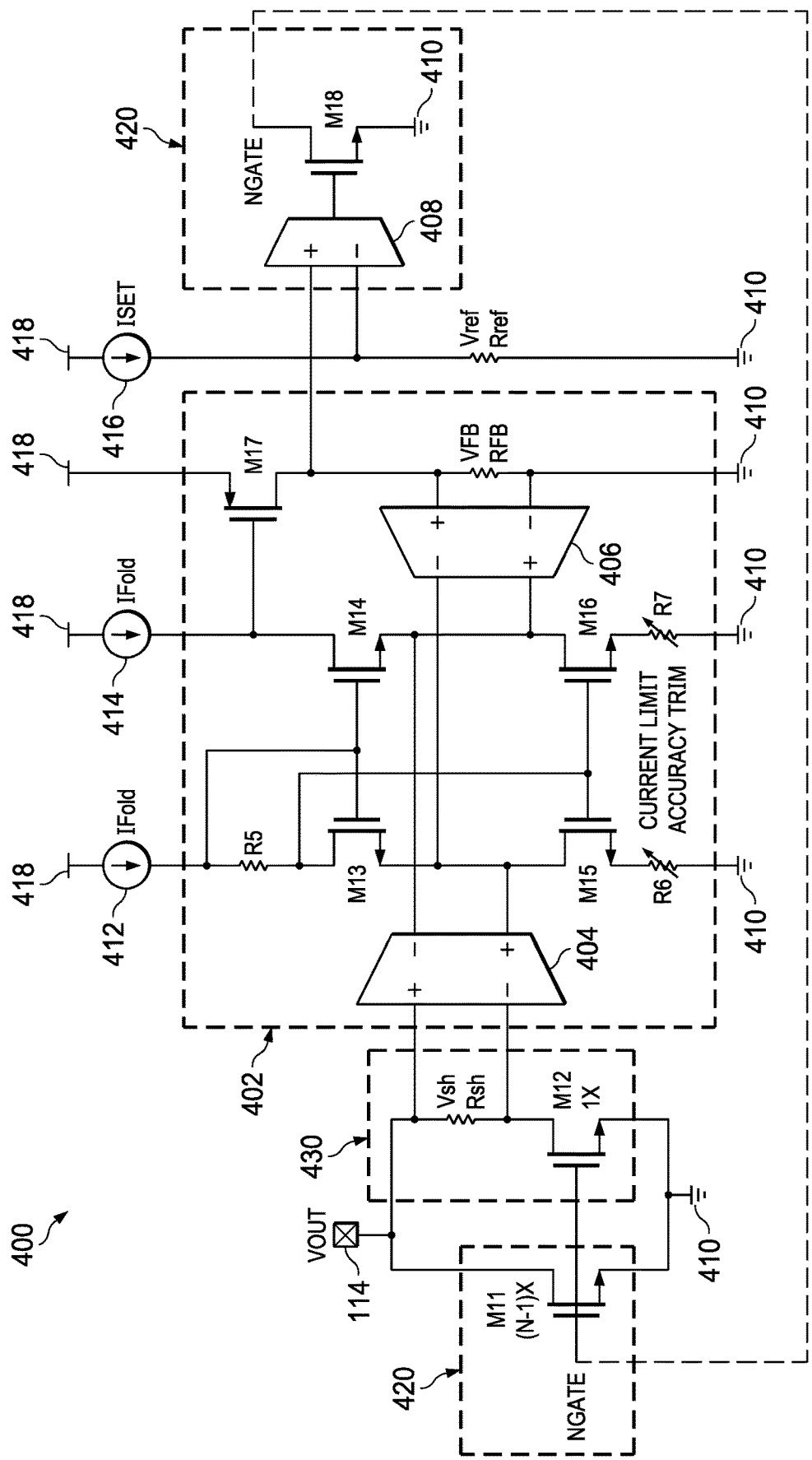
FIG. 4 is a schematic diagram of an indirect current feedback limiter in accordance with an example embodiment.

FIG. 4 is a schematic diagram of an indirect current feedback current limiter 400 (an example of the indirect current feedback current limiter 120 in FIG. 1, or the indirect current feedback current limiter 120A in FIGS. 2 and 3) in accordance with an example embodiment. In the example of FIG. 4, the indirect current feedback current limiter 400 is a current limit circuit having an output current sense voltage circuit 430 configured to provide an output current sense voltage (e.g., the voltage differential, Vsh, across the resistor Rsh in FIG. 4). The indirect current feedback current limiter 400 also includes an indirect current feedback circuit 402 configured to provide an output current feedback sense voltage (e.g., VFB) responsive to the output current sense voltage (e.g., Vsh). The indirect current feedback current limiter 400 further includes control circuitry 420 coupled to the indirect current feedback circuit 402. The control circuitry 420 is configured to vary a resistance between the output stage output 114 and a ground terminal 410 (an example of the ground terminal 116 in FIG. 1, or the ground terminal 216 in FIGS. 2 and 3) responsive to a difference between the output current feedback sense voltage (VFB) and a reference voltage (Vref).

In some example embodiments, the output current sense voltage circuit 430 includes a voltage divider having: a shunt resistor (Rsh) with a first side and a second side. The first side of Rsh is coupled to the output stage output 114. The voltage divider also includes a transistor (M12) (e.g. an NMOS device) having a first current terminal, a second current terminal, and a control terminal. The size (e.g., W/L) of M12 is given as "1X". By contrast, the size (e.g., W/L) of M11 (e.g. an NMOS device) in the control circuit 420, which shares a gate control signal with M12, is (N−1)X. In some example embodiments, N is an integer equal to 2 or more. As shown, the drain of M12 is coupled to the second side of Rsh. The source of M12 is coupled to the ground terminal 410. The gate of M12 is configured to receive a control signal from the control circuitry 420.

A power FET can be used at the output stage output 114 for current sense operations. By using M11 and M21 in some example embodiments, the power FET structure is split into two parts where Rsh is placed on the smaller current portion with M12. By increasing the size of M11 relative to M12 (or decreasing the size of M12 relative to M11), the on-chip layout of Rsh is facilitated. In other words, the size of M12 and Rsh can be selected to facilitate on-chip layout. An additional advantage of having a Rsh connected to the drain terminal of M12 is that the accuracy of the current ratio between M11 and M12 is not affected, because shunt voltage (Vsh) across Rsh is maintained to be less than about 150 mV so that the VDS mismatch between both M11 and M12 is not appreciable. By using Rsh as part of a two-part power FET design, there will be no additional current used to sense OUT. This makes the current consumption of an operational amplifier (e.g., the operational amplifier 104 in FIG. 1, the operational amplifier 200 in FIG. 2, or the operational amplifier 300 in FIG. 3) without the load almost constant with OUT.

In some example embodiments, the control circuitry 420 includes: a transconductance stage 408 with a first transconductance stage input (the non-inverting "+" input of the transconductance stage 408), a second transconductance stage input (the inverting "−" input of the transconductance stage 408) and a transconductance stage output. The first transconductance stage input is configured to receive VFB from the indirect current feedback circuit 402. The second transconductance stage input is configured to receive Vref. The control circuitry 420 also includes transistor (M18)(e.g. an NMOS device) with a first current terminal (the drain terminal of M18), a second current terminal (the source terminal of M18), and a control terminal (the gate terminal of M18). The source terminal of M18 is coupled to the ground terminal 410, and the gate terminal of M18 is coupled to the output of the transconductance stage 408.

In some example embodiments, M18 is a first transistor of the control circuitry 420, and the gate terminal of M18 is a first control terminal. In addition, the control circuitry 420 includes a second transistor (M11) having a third current terminal (the drain terminal of M11), a fourth current terminal (the source terminal of M11) and a second control terminal (the gate terminal of M11). The drain terminal of M11 is coupled to the output stage output 114, and the source terminal of M11 is coupled to the ground terminal 410. The gate terminal of M11 is coupled to the drain terminal of M18. In some example embodiments, Vref is adjustable to limit an output current of the operational amplifier to a predetermined range that includes 50 mA-200 mA.

As shown in FIG. 4, the indirect current feedback current limiter 400 also includes: a voltage supply terminal or input 418, and a reference resistor (Rref) having a first side and a second side. The second side of Rref is coupled to the ground terminal 410. The indirect current feedback current limiter 400 further includes an adjustable reference current (ISET) source 416 coupled between the voltage supply terminal 418 and the first side of Rref.

In some example embodiments, the indirect current feedback circuit 402 includes: a first transconductance stage 404 with a first transconductance stage input (the non-inverting input ("+") of the first transconductance stage 404); a second transconductance stage input (the inverting input ("−") of the first transconductance stage 404); a first transconductance stage output (the inverting output ("−") of the first transconductance stage 404); and a second transconductance stage output (the non-inverting output ("+") of the first transconductance stage 404). In the example of FIG. 4, the inverting and non-inverting transconductance stage inputs are coupled to opposite sides of Rsh to receive a voltage differential corresponding to the output current sense voltage, Vsh (the voltage drop across resistor Rsh). The indirect current feedback circuit 402 also includes a second transconductance stage 406 with a third transconductance stage input (the inverting input ("−") of the second transconductance stage 406), a fourth transconductance stage input (the non-inverting input ("+") of the second transconductance stage 406), a third transconductance stage output (the non-inverting output ("+") of the second transconductance stage 406), and a fourth transconductance stage output (the inverting output ("−") of the second transconductance stage 406). The inverting and non-inverting transconductance stage inputs of the second transconductance stage 406 are coupled to opposite sides of a resistor (RFB) to adjust a current through RFB and thus provide the output current feedback sense voltage, VFB (e.g. the voltage drop across resistor RFB).

In some example embodiments, the indirect current feedback current limiter 400 also includes a first current source 412 and a second current source 414. Each of these current source provide a current with a magnitude of IFold. In addition, the indirect current feedback circuit 402 includes: a first resistor (R5) with a first side and a second side; a second resistor (R6) with a first side and a second side; and a third resistor (R7) with a first side and a second side. As shown, the indirect current feedback circuit 402 also includes a first transistor (M13)(e.g. an NMOS device) having a first current terminal (the drain terminal of M13), a second current terminal (the source terminal of M13) and a first control terminal (the gate terminal of M13). The drain terminal of M13 is coupled to the second side of R5. The source terminal of M13 is coupled to the non-inverting output of the first transconductance stage 404 and the inverting output of the second transconductance stage 406. The indirect current feedback circuit 402 also includes a second transistor (M14) (e.g. an NMOS device) having a third current terminal (the drain terminal of M14), a fourth current terminal (the source terminal of M14) and a second control terminal (the gate terminal of M14). The drain terminal is coupled to a first side of the second current source 414. The second side of the second current source 414 is coupled to the voltage supply terminal 418. The source terminal of M14 is coupled to the inverting output of the first transconductance stage 404 and the non-inverting output of the second transconductance stage 406. The gate terminal of M14 is coupled to the gate terminal of M13, the first side of R5, and a first side of the first current source 412. The second side of the first current source 412 is coupled to the voltage supply terminal 418.

In some example embodiments, the indirect current feedback circuit 402 also includes a third transistor (M15) (e.g. an NMOS device) with a fifth current terminal (the drain terminal of M15), a sixth current terminal (the source terminal of M15) and a third control terminal (the gate terminal of M15). The drain terminal of M15 is coupled to the source terminal of M13. The source terminal of M15 is coupled to a first side of R6. Also, the gate terminal of M15 is coupled to the second side of R5.

In some example embodiments, the indirect current feedback circuit 402 also includes a fourth transistor (M16) (e.g. an NMOS device) with a seventh current terminal (the drain terminal of M16), an eighth current terminal (the source terminal of M16) and a fourth control terminal (the gate terminal of M16). The drain terminal of M16 is coupled to the source terminal of M14. The source terminal of M16 is coupled to the first side of R7. The gate terminal of M16 is coupled to the gate terminal of M15. In the example of FIG. 4, the second sides of R6 and R7 are coupled to the ground terminal 410. In some example embodiments, R6 and R7 are trimmable resistors.

Without limitation to other example embodiments, the indirect current feedback circuit 402 of FIG. 4 uses an Indirect Current Feedback (ICFB) Instrumentation amplifier (INA) topology to transfer Vsh to a ground referenced resistor (RFB). The accuracy of the ICFB INA topology is defined by the linearity and offset error of the first and second transconductance stages 404 and 406 as well as the offsets of the folded cascode structure formed by transistors M13-M16. As desired, gain error can be easily accounted for by cascoding the first and second transconductance stages 404 and 406. Also, the first and second transconductance stages 404 and 406 may be degenerated (e.g., by adding a resistance in series with transistor source terminals of the first and second transconductance stages 404 and 406) to improve linearity and thus avoid completely skewing even for max Vsh. Also, amplifier offsets can be made smaller by optimizing the sizes of the input devices and fold current sources/mirrors. All of these possible errors in the ICFB INA topology can be lumped together as an offset error, which is corrected for by trimming the folded cascode. The trimming can be done either by adding trim currents or trimming the degeneration resistors (R6 and R7) in the fold. Another way this can be improved in a mixed-signal environment is by chopping the ICFB INA structure to eliminate all low frequency errors.

In operation, ISET is externally set and is converted to Vref using Rref. Vref is compared with VFB by the transconductance stage 408, where VFB is the voltage across RFB. VFB is the same as Vsh and thus represents the output current. The transconductance stage 408 is used to ensure that the Vsh does not exceed Vref, thus achieving current limit in the power stage. The accuracy of the transconductance stage 408 can also be lumped into the accuracy of the ICFB INA topology of the indirect current feedback circuit 402. As an alternative, the transconductance stage 408 may also implement other techniques to reduce DC and low-frequency errors. These techniques could include chopping, trimming, auto-zeroing, etc. A chopped transconductance stage modulates and filters low frequency errors at a high frequency at the cost of very small offset/gain errors and performance over temperature.

In operation, the transconductance stage 408 controls the NGATE voltage of the power FETs M11 and M12, and modulates the current through the actuating transistor to control the value of NGATE during current limit. In some example embodiments, the ratio of the OUT limit to ISET is as follows:

$$\frac{I_{out}}{I_{set}} = \frac{N \cdot R_{ref}}{R_{sh}}$$

As resistor ratios can be made extremely accurate with good layout, the ratio is well maintained. In some example embodiments, the range for Vsh is 1 mV to 125 mV for OUT around 2 mA to 250 mA. Also, in some example embodiments, the first and second transconductance stages 404 and 406 are degenerated by approximately 200 mV.

In some example embodiments, the indirect current feedback current limiter 400 has positive output (Pside) voltage circuitry and negative output (Nside) voltage circuitry. In some examples, the Nside voltage circuitry has NMOS devices including M11-M16 and M18. The Pside voltage circuitry (not shown) would include a set of a PMOS devices (Pside counterparts of M11-M16 and M18). Relative to the Nside voltage circuitry, the Pside voltage circuitry is a true complementary implementation, where all NMOS transistors become PMOS transistors and vice versa.

Figure 5:
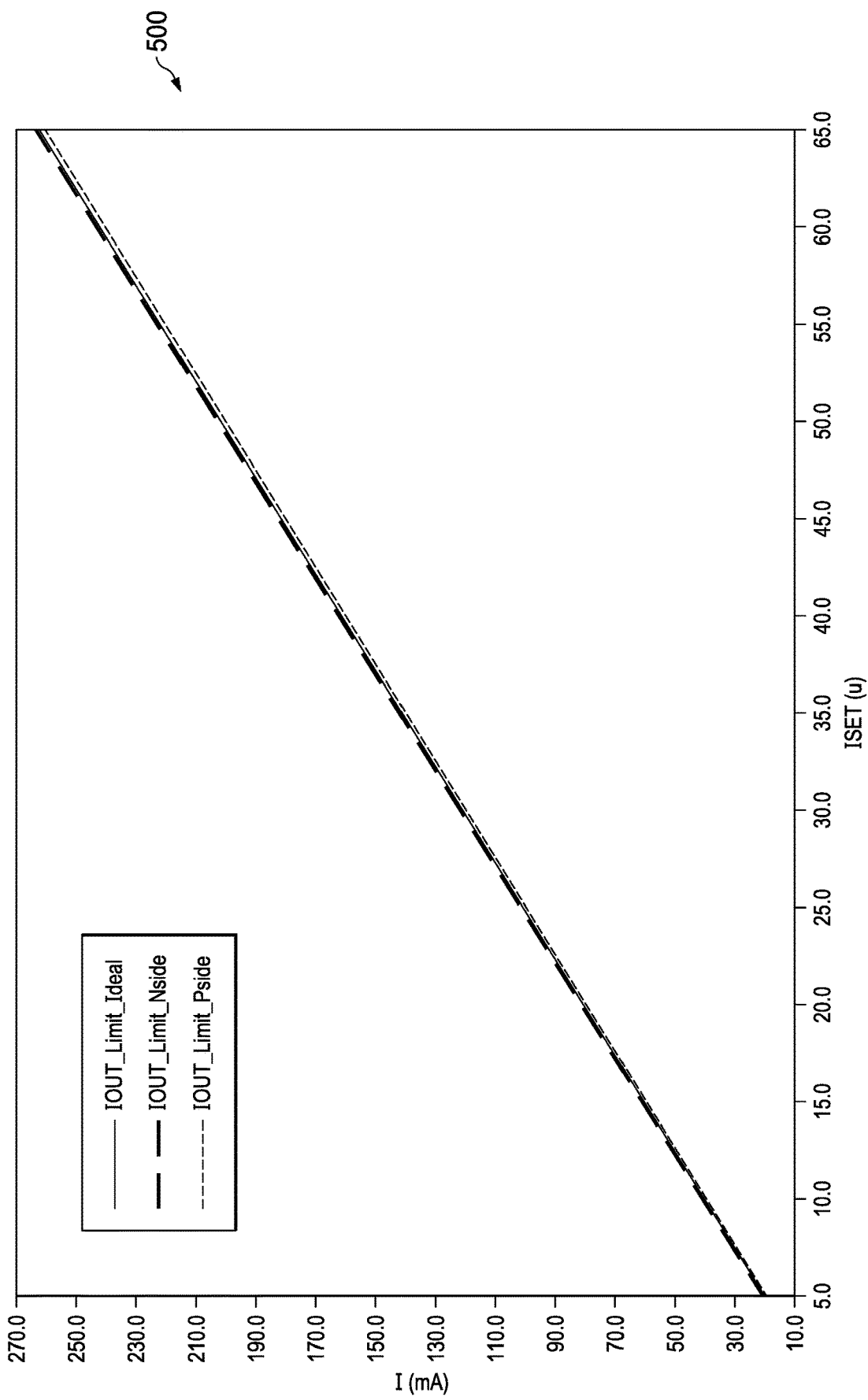
FIG. 5 is a graph of an output current of an operational amplifier as a function of a reference current setting.

FIG. 5 is a graph 500 of an output current of an operational amplifier as a function of a reference current setting. As shown in the graph 500, OUT limit is adjustable as a function of ISET. Also, the OUT limit for both the Pside voltage and Nside voltage closely tracks the ideal OUT limit.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component. Regarding components with different sides (e.g., a resistor or other component(s) with a first side and a second side), these different sides may be referred to as terminals as well. Uses of the phrase "ground" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/− 10 percent of the stated value.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

While the example embodiments above utilize n-channel metal-oxide-silicon field-effect transistors (nMOSFETs) and p-channel MOSFETs (pMOSFETs), other example embodiments may utilize NPN bipolar junction transistors (BJTs), PNP BJTs, or any other type of transistor. Hence, when referring to a current terminal, such terminal may be an emitter, collector, source or drain. In addition, the control terminal may be a base or a gate.

Modifications are possible in the described embodiments, and other embodiments are possible, within the scope of the claims.

What is claimed is:

1. A circuit, comprising:
    an operational amplifier having:
        a positive input;
        a negative input;
        an operational amplifier output;
        a differential front end with differential inputs and differential outputs, the differential inputs coupled to the positive and negative inputs;
        a positive channel (PCH) input stage with PCH inputs and an PCH output, the PCH inputs coupled to the differential outputs;
        a negative channel (NCH) input stage with NCH inputs and an NCH output, the NCH inputs coupled to the differential outputs; and
        an output stage with output stage inputs and an output stage output, the output stage inputs coupled to the PCH and NCH outputs; and
    a current limit circuit coupled to the output stage output, the current limit circuit having:
        an output current sense voltage circuit having an output;
        an indirect current feedback circuit coupled to the output of the output current sense voltage circuit, the indirect current feedback circuit having an output; and
        control circuitry coupled to the indirect current feedback circuit.

2. The circuit of claim 1, wherein the output current sense voltage circuit includes a voltage divider having:
    a shunt resistor with a first side and a second side, the first side coupled to the output stage output; and
    a transistor having a first current terminal, a second current terminal and a control terminal, the first current terminal coupled to the second side of the shunt resistor, the second current terminal coupled to ground, and the control terminal configured to receive a control signal from the control circuitry.

3. The circuit of claim 1, wherein the control circuitry includes:
    a transconductance stage with a first transconductance stage input, a second transconductance stage input and a transconductance stage output, the first transconductance stage input configured to receive the output current feedback sense voltage from the indirect current feedback circuit, and the second transconductance stage input configured to receive the reference voltage; and
    a transistor with a first current terminal, a second current terminal, and a control terminal, the second current terminal coupled to ground, the control terminal coupled to the transconductance stage output.

4. The circuit of claim 3, wherein the transistor is a first transistor, the control terminal is a first control terminal, the control circuitry includes a second transistor having a third current terminal, a fourth current terminal and a second control terminal, the third current terminal is coupled to the output stage output, the fourth current terminal is coupled to ground, and the second control terminal is coupled to first current terminal of the first transistor.

5. The circuit of claim 1, wherein the reference voltage is adjustable to limit an output current of the operational amplifier to a predetermined range that includes 50 mA-200 mA.

6. The circuit of claim 4, wherein the current limit circuit includes:
   a voltage supply input;
   a reference resistor having a first side and a second side, the second side coupled to ground; and
   an adjustable current source coupled between the voltage supply input and the first side of the reference resistor.

7. The circuit of claim 1, wherein the indirect current feedback circuit includes:
   a first transconductance stage with a first transconductance stage input, a second transconductance stage input, a first transconductance stage output and a second transconductance stage output, the first and second transconductance stage inputs coupled to opposite sides of a shunt resistor to receive a voltage differential corresponding to the output current sense voltage;
   a second transconductance stage with a third transconductance stage input, a fourth transconductance stage input, a third transconductance stage output and a fourth transconductance stage output, the third and fourth transconductance stage inputs coupled to opposite sides of a feedback resistor to adjust a current through the feedback resistor to provide the output current feedback sense voltage.

8. The circuit of claim 7, wherein the current limit circuit includes:
   a first current source;
   a second current source; and
   the indirect current feedback circuit includes:
      a first resistor with a first side and a second side;
      a second resistor with a first side and a second side;
      a third resistor with a first side and a second side;
      a first transistor having a first current terminal, a second current terminal and a first control terminal, the first current terminal coupled to the second side of the first resistor, the second current terminal coupled to the second and third transconductance stage outputs;
      a second transistor having a third current terminal, a fourth current terminal and a second control terminal, the third current terminal coupled to the second current source, the fourth current terminal coupled to the first and fourth transconductance stage outputs, and the second control terminal the coupled to the first control terminal, the first side of the first resistor and the first current source;
      a third transistor with a fifth current terminal, a sixth current terminal and a third control terminal, the fifth current terminal coupled to the second current terminal, the sixth current terminal coupled to the first side of the second resistor, and the third control terminal coupled to the second side of the first resistor; and
      a fourth transistor with a seventh current terminal, an eighth current terminal and a fourth control terminal, the seventh current terminal coupled to the fourth current terminal, the eighth current terminal coupled to the first side of the third resistor, and the fourth control terminal coupled to the third control terminal.

9. The circuit of claim 8, wherein the second sides of the second and third resistors are coupled to ground, and the second and third resistors are trimmable resistors.

10. The circuit of claim 8, wherein the current limit circuit has positive output voltage circuitry and negative output voltage circuitry, the positive output voltage circuitry having p-type metal oxide semiconductor (PMOS) devices including the first, second, third and fourth transistors, and the negative output voltage circuitry including a set of a n-type metal oxide semiconductor (NMOS) devices.

11. A system, comprising:
   an operational amplifier having:
      a positive signal input;
      a negative signal input; and
      an amplifier output; and
   a current limit circuit coupled to the amplifier output and configured to:
      generate an output current sense voltage in response to an output voltage of the operational amplifier;
      generate an output current feedback sense voltage responsive to the output current sense voltage; and
      limit an output current at the amplifier output responsive to the generated output current feedback sense voltage.

12. The system of claim 11, wherein the current limit circuit includes:
   an output current sense voltage circuit configured to obtain the output current sense voltage;
   an indirect current feedback circuit configured to generate the output current feedback sense voltage responsive to the output current sense voltage; and
   control circuitry coupled to the indirect current feedback circuit and configured limit the output current at the amplifier output responsive to the generated output current feedback sense voltage.

13. The system of claim 12, wherein the output current sense voltage circuit includes a voltage divider having:
   a shunt resistor with a first side and a second side, the first side coupled to an output stage output; and
   a transistor having a first current terminal, a second current terminal and a control terminal, the first current terminal coupled to the second side of the shunt resistor, the second current terminal coupled to ground, and the control terminal configured to receive a control signal from the control circuitry.

14. The system of claim 12, wherein the control circuitry includes:
   a transconductance stage with a first transconductance stage input, a second transconductance stage input and a transconductance stage output, the first transconductance stage input configured to receive the output current feedback sense voltage from the indirect current feedback circuit, the second transconductance stage input configured to receive a reference voltage, and the control circuitry configured to vary a resistance between the amplifier output and ground responsive to a difference between the output current feedback sense voltage and the reference voltage; and
   a transistor with a first current terminal, a second current terminal, and a control terminal, the second current terminal coupled to ground, the control terminal coupled to the transconductance stage output.

15. The system of claim 14, wherein the transistor is a first transistor, the control terminal is a first control terminal, the control circuitry includes a second transistor having a third current terminal, a fourth current terminal and a second control terminal, the third current terminal is coupled to an output stage output, the fourth current terminal is coupled to ground, and the second control signal is coupled to first current terminal of the first transistor.

16. The system of claim 14, wherein the reference voltage is adjustable to limit the output current of the operational amplifier to a predetermined range that includes 50 mA-200 mA.

17. The system of claim 12, wherein the current limit circuit includes:
   a voltage supply input;
   a reference resistor having a first side and a second side, the second side coupled to ground; and
   an adjustable current source coupled between the voltage supply input and the first side of the reference resistor.

18. The system of claim 12, wherein the indirect current feedback circuit includes:
   a first transconductance stage with a first transconductance stage input, a second transconductance stage input, a first transconductance stage output and a second transconductance stage output, the first and second transconductance stage inputs coupled to opposite sides of a shunt resistor to receive a voltage differential corresponding the output current sense voltage; and
   a second transconductance stage with a third transconductance stage input, a fourth transconductance stage input, a third transconductance stage output and a fourth transconductance stage output, the third and fourth transconductance stage inputs coupled to opposite sides of a feedback resistor to adjust a current through the feedback resistor to generate the output current feedback sense voltage.

19. The system of claim 18, wherein the current limit circuit includes:
   a first current source;
   a second current source; and
   the indirect current feedback circuit includes:
      a first resistor with a first side and a second side;
      a second resistor with a first side and a second side;
      a third resistor with a first side and a second side;
      a first transistor having a first current terminal, a second current terminal and a first control terminal, the first current terminal coupled to the second side of the first resistor, the second current terminal coupled to the second and third transconductance stage outputs;
      a second transistor having a third current terminal, a fourth current terminal and a second control terminal, the third current terminal coupled to the second current source, the fourth current terminal coupled to the first and fourth transconductance stage outputs, and the second control terminal the coupled to the first control terminal, the first side of the first resistor and the first current source;
      a third transistor with a fifth current terminal, a sixth current terminal and a third control terminal, the fifth current terminal coupled to the second current terminal, the sixth current terminal coupled to the first side of the second resistor, and the third control terminal coupled to the second side of the first resistor; and
      a fourth transistor with a seventh current terminal, an eighth current terminal and a fourth control terminal, the seventh current terminal coupled to the fourth current terminal, the eighth current terminal coupled to the first side of the third resistor, and the fourth control terminal coupled to the third control terminal.

20. The system of claim 19, wherein the second sides of the second and third resistors are coupled to ground, and the second and third resistors are trimmable resistors.

21. The system of claim 19, wherein the current limit circuit has positive output voltage circuitry and negative output voltage circuitry, the positive output voltage circuitry having p-type metal oxide semiconductor (PMOS) devices including the first, second, third and fourth transistors, and the negative output voltage circuitry including a set of a n-type metal oxide semiconductor (NMOS) devices.

22. A current limiter comprising:
   an input;
   a first resistor coupled between the input and ground, the first resistor having a first terminal and a second terminal;
   a first amplifier having a first input connected to the first terminal of the first resistor, a second input connected to the second terminal of the first resistor, a first output and a second output;
   a second amplifier having a third input, a fourth input, a third output coupled to the second output of the first amplifier, and a fourth output coupled to the first output of the first amplifier;
   a second resistor coupled between the third input and the fourth input;
   a third resistor coupled between the second output and ground; and
   a fourth resistor coupled between the fourth output and ground.

* * * * *